(12) United States Patent
Chan (10) Patent No.: US 11,349,488 B2
(45) Date of Patent: May 31, 2022

(54) FREQUENCY LOCKED LOOP CIRCUIT, SWITCHING CIRCUIT AND SWITCHING METHOD

(71) Applicant: NOVATEK Microelectronics Corp., Hsinchu (TW)

(72) Inventor: Chin-Tung Chan, New Taipei (TW)

(73) Assignee: NOVATEK Microelectronics Corp., Hsinchu (TW)

( * ) Notice: Subject to any disclaimer, the term of this patent is extended or adjusted under 35 U.S.C. 154(b) by 54 days.

(21) Appl. No.: 16/727,882

(22) Filed: Dec. 26, 2019

(65) Prior Publication Data

US 2021/0203330 A1 Jul. 1, 2021

(51) Int. Cl.
H03L 7/099 (2006.01)
H03L 7/23 (2006.01)
H03L 7/085 (2006.01)

(52) U.S. Cl.
CPC .............. H03L 7/099 (2013.01); H03L 7/085 (2013.01); H03L 7/23 (2013.01)

(58) Field of Classification Search
CPC . H03L 7/085; H03L 7/099; H03L 7/23; H03L 7/0991–0998; H03L 7/087; H03L 7/089; H03L 7/0891; H03L 7/0893; H03L 7/235; H03L 7/091–097; H03L 7/0895; H03L 7/0896; H03L 7/0898
See application file for complete search history.

(56) References Cited

U.S. PATENT DOCUMENTS 8,054,141 B2 11/2011 Saw
8,269,567 B2 9/2012 Colin et al.
9,356,554 B2 * 5/2016 Tam ..................... H03K 4/502
9,490,744 B2 11/2016 Jang et al.
2013/0200956 A1 8/2013 Hsiao et al.
(Continued)

OTHER PUBLICATIONS

A. Paidimarri, D. Griffith, A. Wang, A. P. Chandrakasan and G. Burra, "A 120nW 18.5kHz RC Oscillator with Comparator Offset Cancellation for ±0.25% Temperature Stability," 2013 IEEE International Solid-State Circuits Conference Digest of Technical Papers, San Francisco, CA, 2013, pp. 184-185. doi: 10.1109/ISSCC.2013. 6487692.

(Continued)

*Primary Examiner* — Patrick C Chen
(74) *Attorney, Agent, or Firm* — CKC & Partners Co., LLC (57) ABSTRACT

A frequency locked loop circuit, including a frequency generation circuit, a first impedance circuit, a second impedance circuit and a switching circuit. The frequency generation circuit includes a positive terminal and a negative terminal. The frequency generation circuit outputs an output clock signal according to a voltage difference between the positive terminal and the negative terminal. The first impedance circuit and the second impedance circuit are electrically coupled to a first impedance node and a second impedance node, respectively. The second impedance circuit adjusts an impedance value of the second impedance circuit according to the output clock signal. The switching circuit is configured to periodically conduct the negative terminal to one of the first impedance node and the second impedance node, and periodically conduct the positive terminal to the other one of the first impedance node and the second impedance node.

13 Claims, 5 Drawing Sheets

(56) References Cited

U.S. PATENT DOCUMENTS

2014/0062610 A1     3/2014    Ito
2020/0343858 A1*   10/2020   Matsuno .................. H03B 5/24

OTHER PUBLICATIONS

A. Paidimarri, D. Griffith, A. Wang, G. Burra and A. P. Chandrakasan, "An RC Oscillator With Comparator Offset Cancellation," in IEEE Journal of Solid-State Circuits, vol. 51, No. 8, pp. 1866-1877, Aug. 2016. doi: 10.1109/JSSC.2016.2559508.

K. Ueno, T. Asai and Y. Amemiya, "A 30-MHz, 90-ppm/° C. Fully-integrated Clock Reference Generator with Frequency-Locked Loop," 2009 Proceedings of ESSCIRC, Athens, 2009, pp. 392-395. doi: 10.1109/ESSCIRC.2009.5325940.

T. Jang, M. Choi, S. Jeong, S. Bang, D. Sylvester and D. Blaauw, "A 4.7nW 13.8ppm/° C. Self-Biased Wakeup Timer Using a Switched-Resistor Scheme," 2016 IEEE International Solid-State Circuits Conference (ISSCC), San Francisco CA, 2016, pp. 102-103. doi: 10.1109/ISSCC.2016.7417927.

M. Choi, T. Jang, S. Bang, Y. Shi, D. Blaauw and D. Sylvester, "A 110 nW Resistive Frequency Locked On-Chip Oscillator with 34.3 ppm/° C. Temperature Stability for System-on-Chip Designs," in IEEE Journal of Solid-State Circuits, vol. 51, No. 9, pp. 2106-2118, Sep. 2016. doi: 10.1109/JSSC.2016.2586178.

K. Pappu, G. P. Reitsma and S. Bapat, "Frequency-Locked-Loop Ring Oscillator with 3ns Peak-to-Peak Accumulated Jitter in 1ms Time Window for High-Resolution Frequency Counting," 2017 IEEE International Solid-State Circuits Conference (ISSCC), San Francisco, CA, 2017, pp. 92-93. doi: 10.1109/ISSCC.2017.7870276.

\* cited by examiner

FREQUENCY LOCKED LOOP CIRCUIT, SWITCHING CIRCUIT AND SWITCHING METHOD

BACKGROUND

Technical Field

The present disclosure relates to a frequency locked loop circuit, more particularly, a circuit for outputting a clock signal.

Description of Related Art

In electronic products, the clock generator is indispensable. In order to prevent the clock signal generated by the clock generator from being affected by noise, a frequency locked loop circuit will be applied. However, since the frequency locked loop circuit may still cause noise, the frequency locked loop circuit must be adjusted to ensure that the clock signal is correct and stable.

SUMMARY

One aspect of the present disclosure is a frequency locked loop circuit, including a frequency generation circuit, a first impedance circuit, a second impedance circuit and a switching circuit. The frequency generation circuit includes a positive terminal and a negative terminal The negative terminal is electrically coupled to a first current source. The positive terminal is electrically coupled to a second current source. The frequency generation circuit is configured to output an output clock signal according to a voltage difference between the positive terminal and the negative terminal. The first impedance circuit is electrically coupled to a first impedance node. The second impedance circuit is electrically coupled to a second impedance node. The second impedance circuit is configured to adjust an impedance value of the second impedance circuit according to the output clock signal. The switching circuit is electrically coupled to the first impedance node, the second impedance node, the positive terminal and the negative terminal. The switching circuit is configured to periodically conduct the negative terminal to one of the first impedance node and the second impedance node, and periodically conduct the positive terminal to the other one of the first impedance node and the second impedance node.

Another aspect of the present disclosure is a switching circuit, including a first switching unit and a second switching unit. The first switching unit is electrically coupled to a first current source through a negative terminal of a frequency generation circuit, electrically coupled to a first impedance circuit through a first impedance node, and electrically coupled to a second impedance circuit through a second impedance node. The first switching unit is configured to periodically conduct the negative terminal to one of the first impedance node and the second impedance node. The second switching unit is electrically coupled to a second current source through a positive terminal of a frequency generation circuit, electrically coupled to the first impedance circuit through the first impedance node, and electrically coupled to the second impedance circuit through the second impedance node. The second switching unit is configured to periodically conduct the positive terminal to the other one of the first impedance node and the second impedance node.

Another aspect of the present disclosure is a switching method, including the following steps: a switching circuit is electrically couple to a first impedance circuit, a second impedance circuit, a positive terminal of a frequency generation circuit and a negative terminal of the frequency generation circuit. The frequency generation circuit adjusts an impedance value of the second impedance circuit according to an output clock signal outputted. A first switching unit of the switching circuit periodically conducts the negative terminal to one of the first impedance circuit and the second impedance circuit. A second switching unit of the switching circuit periodically conducts the positive terminal to the other one of the first impedance circuit and the second impedance circuit.

It is to be understood that both the foregoing general description and the following detailed description are by examples, and are intended to provide further explanation of the disclosure as claimed.

BRIEF DESCRIPTION OF THE DRAWINGS

The present disclosure can be more fully understood by reading the following detailed description of the embodiment, with reference made to the accompanying drawings as follows.

DETAILED DESCRIPTION

For the embodiment below is described in detail with the accompanying drawings, embodiments are not provided to limit the scope of the present disclosure. Moreover, the operation of the described structure is not for limiting the order of implementation. Any device with equivalent functions that is produced from a structure formed by a recombination of elements is all covered by the scope of the present disclosure. Drawings are for the purpose of illustration only, and not plotted in accordance with the original size.

It will be understood that when an element is referred to as being "connected to" or "coupled to", it can be directly connected or coupled to the other element or intervening elements may be present. In contrast, when an element to another element is referred to as being "directly connected" or "directly coupled," there are no intervening elements present. As used herein, the term "and/or" includes an associated listed items or any and all combinations of more.

Figure 1:
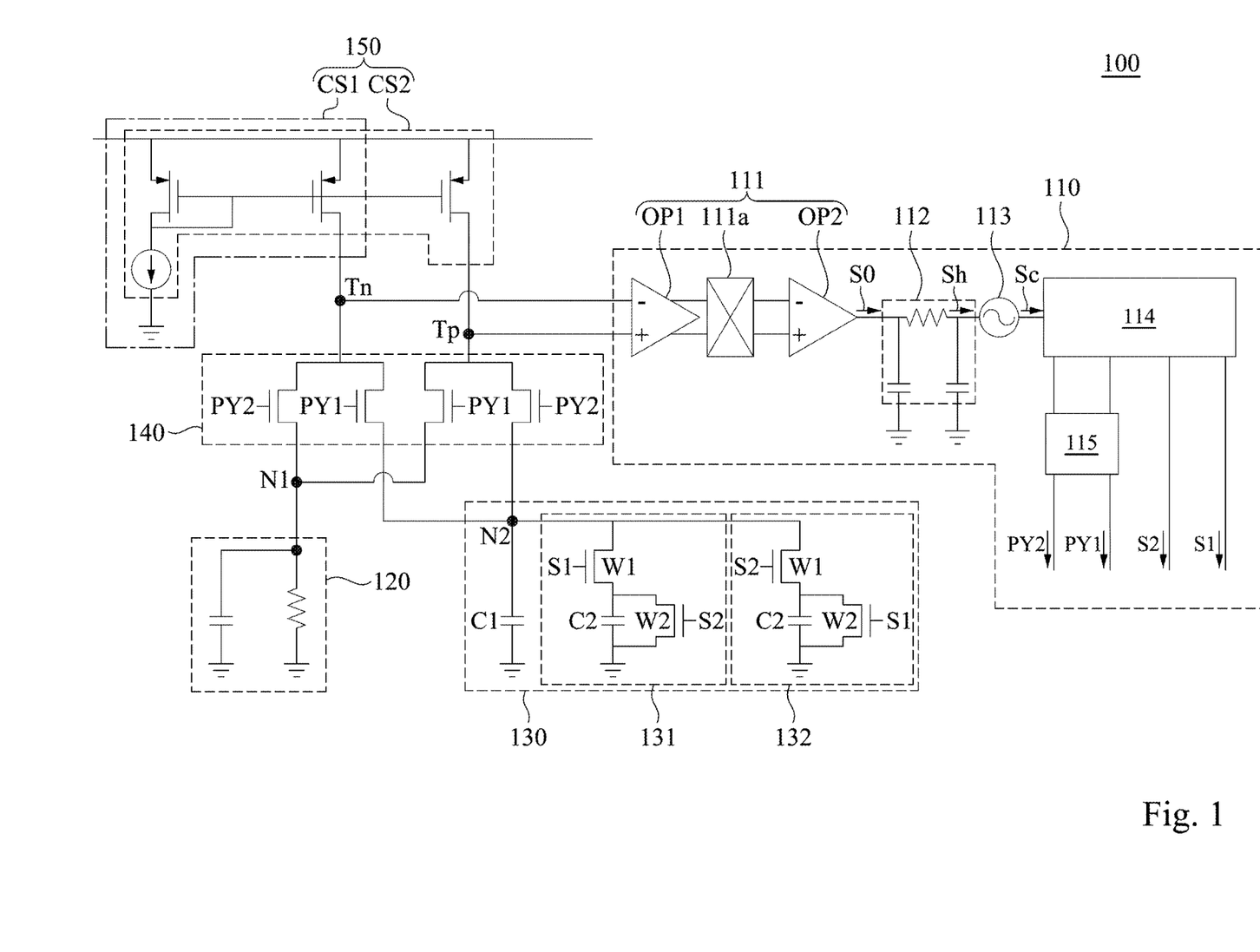
FIG. 1 is a schematic diagram of a frequency locked loop circuit in some embodiments of the present disclosure.

Referring to FIG. 1, FIG. 1 is a schematic diagram of a frequency locked loop (FLL) circuit 100 in some embodiments of the present disclosure. The frequency locked loop circuit 100 includes a frequency generation circuit 110, a first impedance circuit 120, a second impedance circuit 130 and a switching circuit 140. The frequency locked loop circuit 100 is configured to form a loop capable of locking a frequency of an output clock signal Sc. The following briefly describes the operation of the frequency locked loop circuit 100. During operation, a plurality of current sources 150 such as a first current source CS1 and a second current source CS2, are configured to generate a plurality of currents, which are then converted by the first impedance circuit 120 to generate corresponding input voltages. The first impedance circuit 120 provides the corresponding input voltages to the frequency generation circuit 110. The frequency generation circuit 110 is configured to convert the corresponding input voltages to a corresponding frequency, represented by an output clock signal Sc. The output clock signal Sc can be used to generate a plurality of control signals to be feedback to control the operation of the switching circuit 140 and adjusting an impedance value of the second impedance circuit 130, thereby forming a loop capable of locking a frequency of the output clock signal Sc.

The frequency generation circuit 110 can include a positive terminal Tp and a negative terminal Tn. The negative terminal Tn is electrically coupled to a first current source CS1. The positive terminal Tp is electrically coupled to a second current source CS2. The frequency generation circuit 110 is configured to output the output clock signal Sc according to a voltage difference between the positive terminal Tp and the negative terminal Tn.

The first impedance circuit 120 is electrically coupled to a first impedance node N1. The first impedance circuit 120, may include at least one impedance element, which, for example, can include a resistor and a capacitor connected in parallel as shown. The second impedance circuit 130 is electrically coupled to a second impedance node N2. In some embodiments, the impedance value of the second impedance circuit 130 is adjusted according to at least one feedback signal from the frequency generation circuit 110. As shown in FIG. 1, the second impedance circuit 130 is configured to adjust an impedance value of the second impedance circuit 130 according to the output clock signal Sc. Alternatively stated, the impedance value of the second impedance circuit 130 is variable, details will be explained in the following paragraphs. The change of the impedance value of the second impedance circuit 130 according to the feedback signal from the generation circuit 110 causes a difference between the impedance value of the second impedance circuit 130 and an impedance value of the first impedance circuit 120, resulting in a voltage difference between the two impedance nodes N1 and N2, thereby forming a loop capable of locking a frequency of the output clock signal Sc.

The switching circuit 140 is electrically coupled to the first impedance node N1, the second impedance node N2, the positive terminal Tp and the negative terminal Tn. The switching circuit 140 is configured to periodically conduct the negative terminal Tn to one of the first impedance node N1 and the second impedance node N2, and periodically conduct the positive terminal Tp to the other one of the first impedance node N1 and the second impedance node N2. The implementation of the switching circuit 140 can reduce the jitter caused by noises generated by the current sources 150 and the frequency generation circuit 110.

The output clock signal Sc generated by the frequency generation circuit 110, and the frequency of the output clock signal Sc is locked according to the voltage difference between the positive terminal Tp and the negative terminal Tn. However, the signal transmitted by the current source CS1, CS2 has noise causing the jitter. On the other hand, the transistor switch (e.g., transistor in the Operational Amplifier) in the frequency generation circuit 110 also probably generates noise when processing the signal. The embodiment of the present disclosure can periodically switch the negative terminal Tn and the positive terminal Tp to conduct to the first impedance node N1 or the second impedance node N2. Consequently, the jitter caused by noises generated by the current sources 150 and the frequency generation circuit 110 can be reduced.

In addition, the switching circuit 140 is preferably coupled between "the negative terminal Tn/positive terminal Tp" and "the first impedance node N1/second impedance node N2.". Therefore, whether the noise is generated in the current sources CS1, CS2 or the frequency generation circuit 110, noise can be reduced or cancelled by the switching operation of the switching circuit 140. As will described below, the switching operations simultaneously performed by the switching circuit 140 and a chopper operational amplifier 111 in the frequency generation circuit 110 can achieve a complete noise cancellation. Consequently, the output clock signal Sc generated by the frequency locked loop circuit 100 can have less jitter.

In some embodiments, the frequency generation circuit 110 is further configured to generate a first clock signal S1 and a second clock signal S2 according to the output clock signal Sc, and provide the first clock signal S1 and the second clock signal S2 to the second impedance circuit 130. The first clock signal S1 and the second clock signal S2 are configured to control the switches in the second impedance circuit 130 so as to adjust the impedance value of the second impedance circuit 130. In some other embodiments, the first clock signal S1 and the second clock signal S2 may be generated by other circuit or processor, instead of the frequency generation circuit 110. Alternatively stated, the first clock signal S1 and the second clock signal S2 are not limited to be generated by feedback path.

In some embodiments, the frequency generation circuit 110 is further configured to generate a first control signal PY1 and a second control signal PY2 according to the output clock signal Sc, and provide the first control signal PY1 and the second control signal PY2 to the switching circuit 140. The first control signal PY1 and the second control signal PY2 are configured to control the switches in the switching circuit 140 so as to change the conduction state of the switching circuit 140.

Referring to the FIG. 1, FIG. 1 also shows a detailed structure of the frequency generation circuit 110 according to an embodiment. In some embodiments, the frequency generation circuit 110 further includes a chopper operational amplifier 111, a low frequency pass filter 112, a frequency conversion circuit 113. The frequency generation circuit 110 can further include a frequency divider 114. The chopper operational amplifier 111 is configured to receive (or detect) the voltage difference between the positive terminal Tp and the negative terminal Tn to output an operational voltage signal S0. For example, the chopper operational amplifier 111 receives the input signal of the frequency generation circuit 110 through the positive terminal Tp and the negative terminal Tn in a preset time. Then, the chopper operational amplifier 111 is capable of averaging the received input signals. Accordingly, low frequency noise in the output signal of the chopper operational amplifier 111 can be eliminated.

In operation, the switching circuit 140 and the chopper operational amplifier 111 can modulate or shift a low-frequency component (flicker noise) of the noise generated by the current sources 150 and the frequency generation circuit 110 to a high-frequency region. The low frequency pass filter 112 can then filter out the high-frequency noise (i.e. the flicker noise). Since the low-frequency component of the flicker noise is the dominant part of the noise, most of the noise can be reduced. In other words, the switching operations simultaneously performed by the switching circuit 140 and the chopper operational amplifier 111 achieve a complete noise cancellation on the output clock signal Sc.

As shown in FIG. 1, in some embodiments, the chopper operational amplifier 111 includes a first operational amplifier unit OP1, a chopper switch unit 111a and a second operational amplifier unit OP2. The chopper switch unit 111a is electrically coupled to the output terminals of the first operational amplifier unit OP1, and periodically switch each one of the output terminals of the first operational amplifier unit OP1 to be coupled between the input terminals of the second operational amplifier unit OP2. The switching operations simultaneously performed by the switching circuit 140 and the chopper operational amplifier 111 achieve noise cancellation of the output clock signal Sc. In more detail, the switching circuit 140 can modulate the signal to a high frequency region. At this time, if a noise comes from the current sources 150 and the first operational amplifier unit OP1 of the frequency generation circuit 110, the noise can remain in the low frequency region. The switching operation of the chopper switch unit 111a can then modulate the signal back and modulate the noise to the high frequency region. Afterwards, the low frequency pass filter 112 can filter out or reduce the noise shifted to the high frequency region. Since people in the art understand the circuit details of the chopper operational amplifier 111, details will not be described here.

The low frequency pass filter 112 is electrically coupled to an output terminal of the chopper operational amplifier 111 to receive the operational voltage signal S0, and configured to filter a high frequency signal Sh of the operational voltage signal S0.

The frequency conversion circuit 113 is configured to receive an output signal of the low frequency pass filter 112 (i.e., the high frequency signal Sh), and generate the output clock signal Sc. The output clock signal Sc can be served as a frequency locked clock signal output by the frequency generation circuit 110.

The frequency divider 114 is coupled to the frequency conversion circuit 113. The frequency divider 114 is configured to generate the first clock signal 51, the second clock signal S2, the first control signal PY1 and the second control signal PY2 according to the output clock signal Sc. The first clock signal 51 and the second clock signal S2 are configured to control the second impedance circuit 130. The first control signal PY1 and the second control signal PY2 are configured to control the switching circuit 140. The frequency divider 114 provides the first clock signal S1 and the second clock signal S2 to the second impedance circuit 130, and provides the first control signal PY1 and the second control signal PY2 to the switching circuit 140.

In some embodiments, the frequency divider 114 generates the first control signal PY1 and the second control signal PY2 by a non-overlapping circuit 115. The non-overlapping circuit 115 is configured to ensure that the first control signal PY1 and the second control signal PY2 are not turned on at the same time or turned off at the same time.

Figure 2:
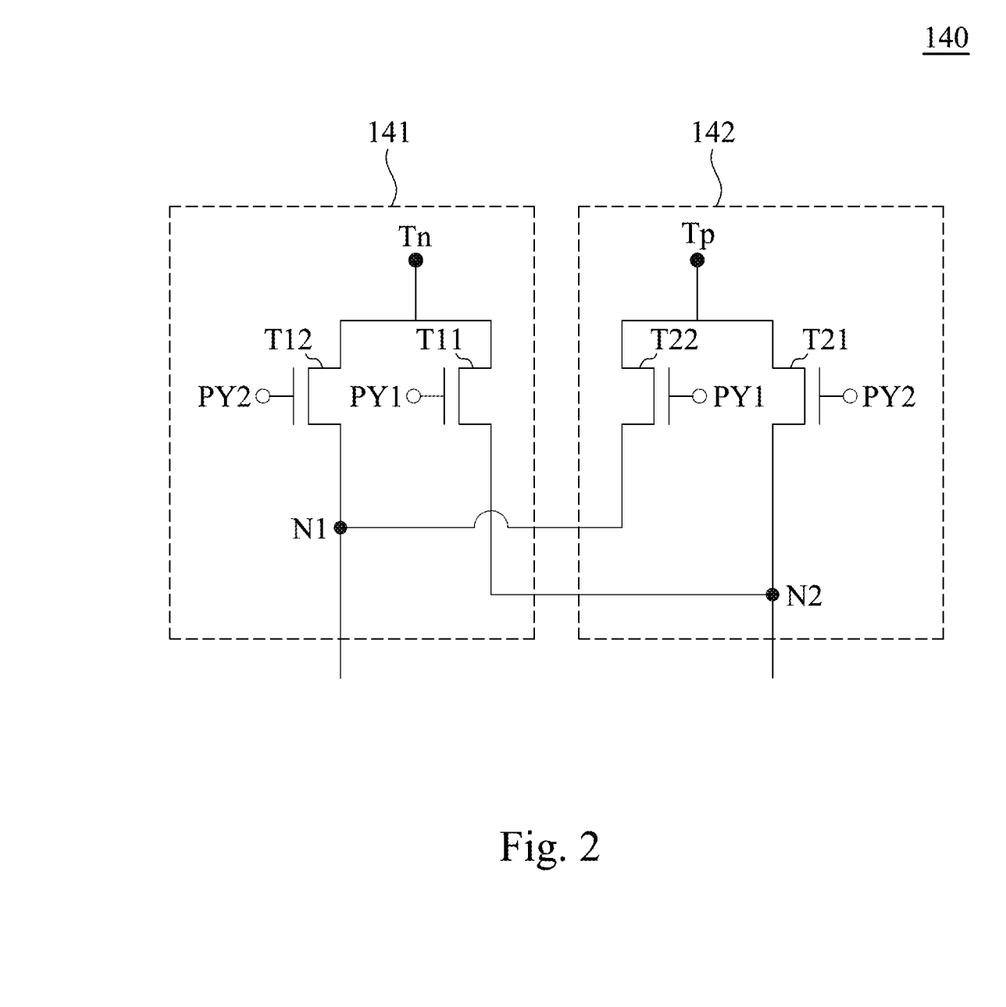
FIG. 2 is a schematic diagram of a switching circuit in some embodiments of the present disclosure.

Referring to FIG. 1 and FIG. 2. FIG. 2 is a schematic diagram of the switching circuit 140 in some embodiments of the present disclosure. The switching circuit 140 includes multiple switching units. In some embodiments, the switching units include a plurality of switching units such as a first switching unit 141 and a second switching unit 142. As shown in FIG. 2, the first switching unit 141 is electrically coupled to the first impedance node N1, the second impedance node N2 and the negative terminal Tn. The first switching unit 141 is configured to conduct the negative terminal Tn to one of the first impedance node N1 and the second impedance node N2 according to a first control signal PY1 and a second control signal PY2.

The second switching unit 142 is electrically coupled to the first impedance node N1, the second impedance node N2 and the positive terminal Tp. The second switching unit 142 is configured to conduct the positive terminal Tp to the other of the first impedance node N1 and the second impedance node N2 according to the first control signal PY1 and the second control signal PY2.

The first switching unit 141 and the second switching unit 142 periodically conduct the negative terminal Tn (or the positive terminal Tp) to the first impedance node N1 or the second impedance node N2 according to the first control signal PY1 and the second control signal PY2. In some embodiments, the frequency of each of the first control signal PY1 and the second control signal PY2 is less than a frequency of the first clock signal S1 and a second clock signal S2. The level of the first control signal PY1 and the level of the second control signal PY2 are opposite.

In some embodiments, each of the switching units 141, 142 includes two transistor switches to periodically conduct the negative terminal Tn (or the positive terminal Tp) to the first impedance node N1 or the second impedance node N2. As shown in FIG. 2, the first switching unit 141 includes a first transistor switch T11 and a second transistor switch T12. The first transistor switch T11 is electrically coupled to the second impedance node N2 and the negative terminal Tn. The first transistor switch T11 is configured to turn on or turn off according to the first control signal PY1. The second transistor switch T12 is electrically coupled to the first impedance node N1 and the negative terminal Tn. The second transistor switch T12 is configured to turn on or turn off according to the second control signal PY2.

Similarly, the second switching unit 142 includes a first transistor switch T21 and a second transistor switch T22. The first transistor switch T21 is electrically coupled to the second impedance node N2 and the positive terminal Tp. The first transistor switch T21 is configured to turn on or turn off according to the first control signal PY2. The second transistor switch T22 is electrically coupled to the first impedance node N1 and the positive terminal Tp. The second transistor switch T22 is configured to turn on or turn off according to the first control signal PY1.

As described above, the impedance value of the second impedance circuit 130 is adjusted according to the first clock signal S1 and the second clock signal S2. The change of the impedance value of the second impedance circuit 130 according to the feedback signal from the generation circuit 110 causes a difference between the impedance value of the second impedance circuit 130 and an impedance value of the first impedance circuit 120, resulting in a voltage difference between the two impedance nodes N1 and N2, thereby forming a loop capable of locking a frequency of the output clock signal Sc.

Referring to the FIG. 1, in some embodiments, the second impedance circuit 130 includes multiple impedance units such as impedance units 131, 132 and a first capacitor C1. Each of the impedance units 131, 132 is coupled between the second impedance node N2 and a reference voltage (e.g., ground). The first capacitor C1 is coupled between the second impedance node N2 and the reference voltage, and is configured to stabilize the voltage of the second node N2.

Taking the impedance unit 131 as an example, the impedance unit 131 includes a first impedance switch W1, a second impedance switch W2 and a second capacitor C2. The first impedance switch W1 is electrically coupled to the second impedance node N2, and is configured to be controlled according to the output clock signal Sc (e.g., the first clock signal S1). The second impedance switch W2 is electrically coupled to the first impedance switch W1 and the reference voltage. The second impedance switch W2 is configured to be controlled according to the output clock signal Sc (i.e., the second clock signal S2). A conducted timing of the first impedance switch W1 and the second impedance switch W2 are opposite. Alternatively stated, the level of the first clock signal S1 and the level of the second clock signal S2 are opposite. The second capacitor C2 is electrically coupled in parallel to the second impedance switch W2 in parallel.

When the first clock signal S1 is enable, the second clock signal S2 is disable, the first impedance switch W1 is turned on and the second impedance switch W2 turned off. At this time, the second capacitor C2 will be charged by the voltage on the second node N2. On the other hand, when the first clock signal S1 is disable, the second clock signal S2 is enable, the first impedance switch W1 is turned off and the second impedance switch W2 turned on. At this time, the second capacitor C2 will discharge through the second impedance switch W2. Consequently, with the change of the first clock signal 51 and the second clock signal S2, the impedance of the impedance unit 131 can change accordingly.

The circuit structure of the impedance unit 132 is same as the impedance unit 131. However, the first impedance switch W1 of the impedance unit 132 is configured to be controlled according to the second clock signal S2, and the second impedance switch W2 of the impedance unit 132 is configured to be controlled according to the first clock signal S1. Accordingly, the second capacitor C2 of the impedance unit 132 and the second capacitor C2 of the impedance unit 1321 will not charge at the same time or discharge at the same time.

Furthermore, in some embodiments, the frequency locked loop circuit 100 further includes a current mirror 150 including the first current source CS1 and the second current source CS2. The first switching unit 141 is electrically coupled to the first current source CS1 through the negative terminal Tn of the frequency generation circuit 110, and is electrically coupled to the second impedance circuit 130 through the second impedance node N2. The first switching unit 141 is configured to periodically conduct the negative terminal Tn to the first impedance node N1 or the second impedance node N2.

The second switching unit 142 is electrically coupled to the second current source CS2 through the positive terminal Tp of the frequency generation circuit 110, and is electrically coupled to the second impedance circuit 130 through the second impedance node N2. The second switching unit 142 is configured to periodically conduct the positive terminal Tp to the first impedance node N1 or the second impedance node N2.

Figure 3:
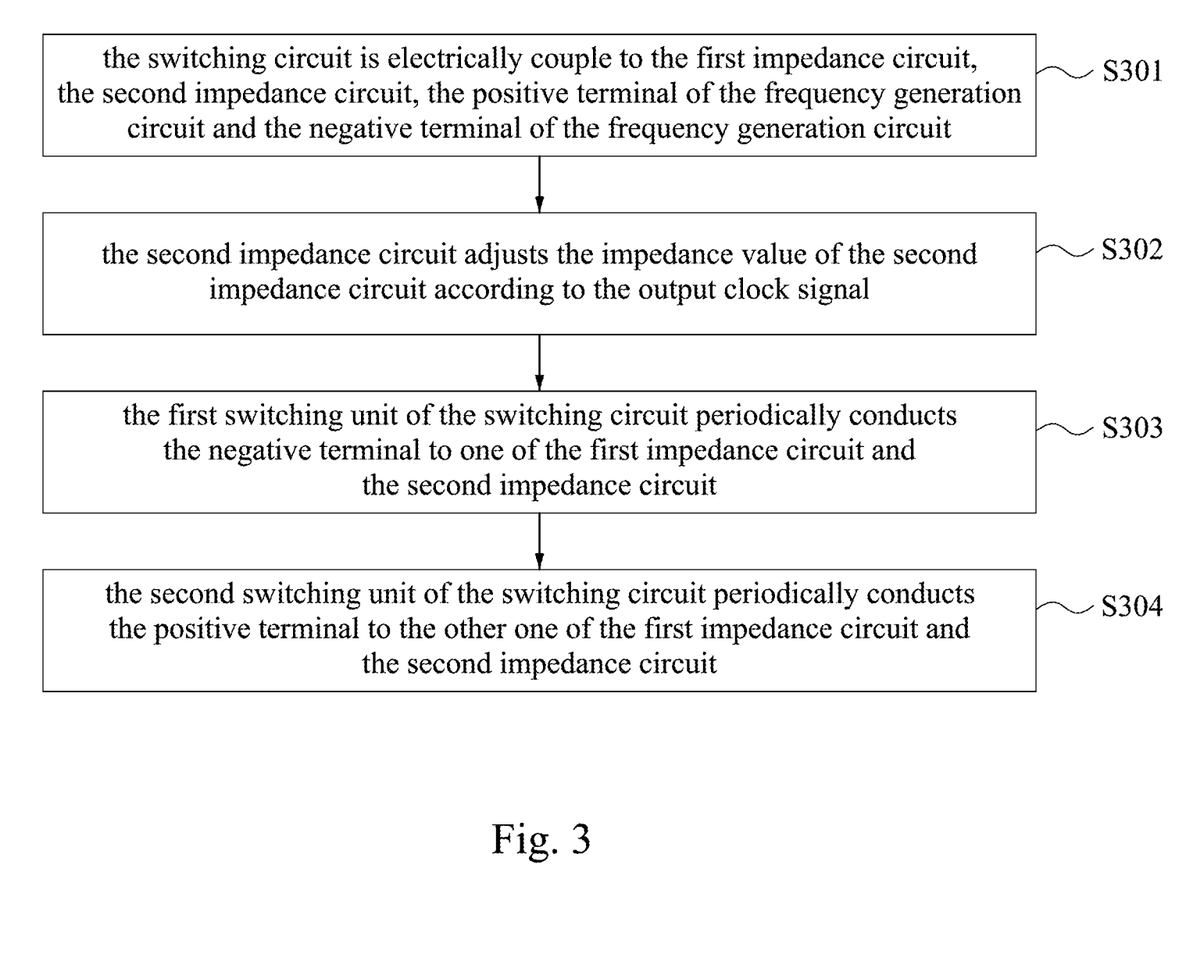
FIG. 3 is a flowchart illustrating a switching method in some embodiments of the present disclosure.

Referring to the FIG. 3, FIG. 3 is a flowchart illustrating a switching method in some embodiments of the present disclosure. In step S301, the switching circuit 14 is electrically couple to the first impedance circuit 120, the second impedance circuit 130, the positive terminal Tp of the frequency generation circuit 110 and the negative terminal Tn of the frequency generation circuit 110. Then, the frequency generation circuit 110 outputs the output clock signal Sc according to a voltage difference between the positive terminal Tp and the negative terminal Tn, and generates the first clock signal S1, the second clock signal S2, the first control signal PY1 and the second control signal PY2 according to the output clock signal Sc.

In step S302, the second impedance circuit 130 adjusts the impedance value of the second impedance circuit 130 according to the output clock signal Sc. In step S303, the first switching unit 141 of the switching circuit 140 periodically conducts the negative terminal Tn to one of the first impedance circuit 120 and the second impedance circuit 130.

In step S304, the second switching unit 142 of the switching circuit 140 periodically conducts the positive terminal Tp to the other one of the first impedance circuit 120 and the second impedance circuit 130.

Figure 4A:
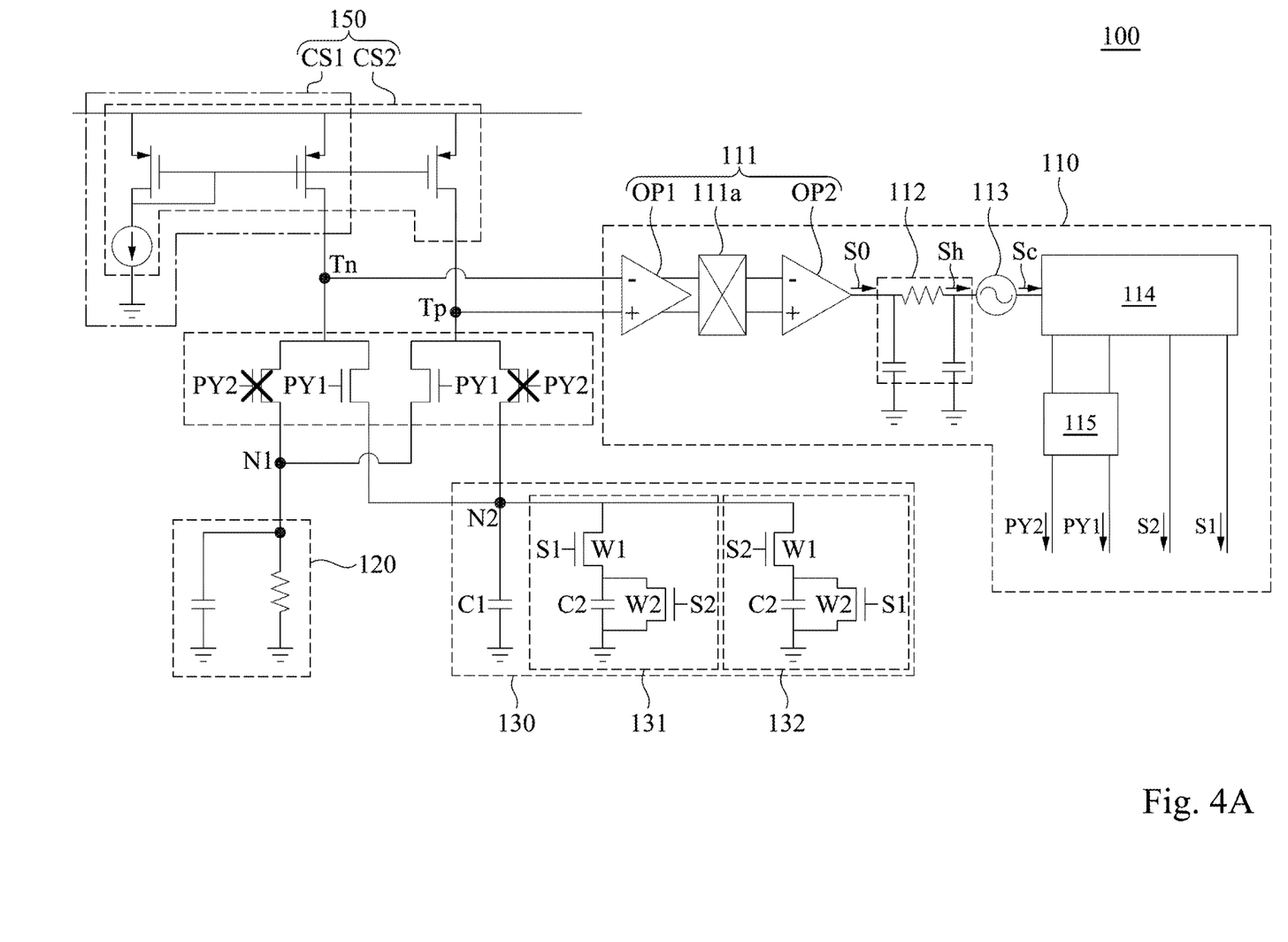
FIG. 4A is a schematic diagram of the operational state of the frequency locked loop circuit in some embodiments of the present disclosure.

Referring to FIG. 1 and FIG. 4A, in a first period, the first control signal PY1 is an enable level, the second control signal PY2 is a disable level. Alternatively stated, a level of the first control signal PY1 and the second control signal PY2 are opposite. Therefore, the first transistor switch T11 and the second transistor switch T22 are turned on. The second transistor switch T12 and the first transistor switch T21 are turned off. At this time, the first switching unit 141 conducts the negative terminal Tn to the second impedance circuit 130 through the first transistor switch T11. The second switching unit 142 conducts the positive terminal Tp to the first impedance circuit 120 through the second transistor switch T22.

Figure 4B:
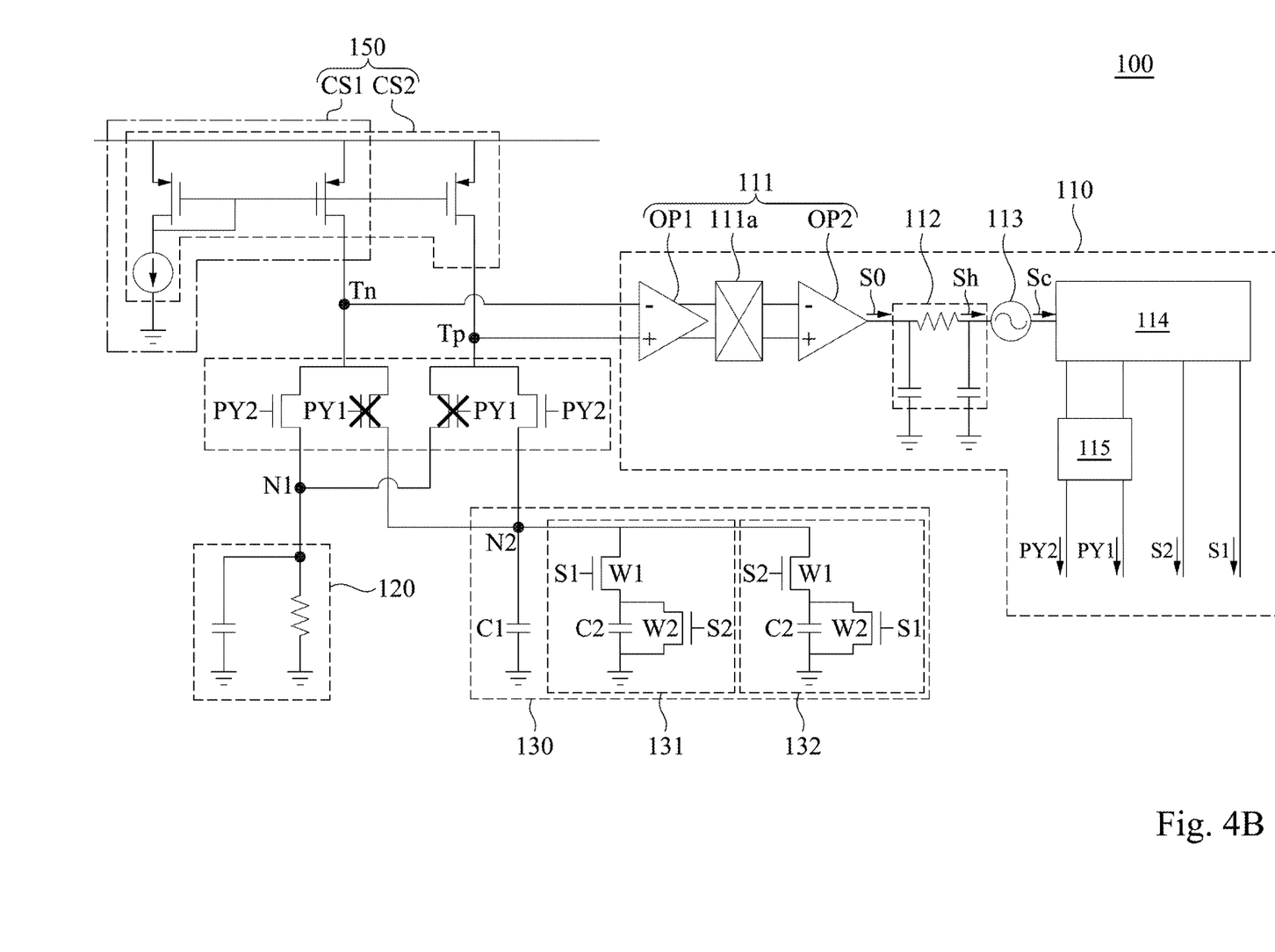
FIG. 4B is a schematic diagram of the operational state of the frequency locked loop circuit in some embodiments of the present disclosure.

Similarly, referring to FIG. 1 and FIG. 4B, in a second period, the first control signal PY1 is the disable level, the second control signal PY2 is the enable level. Therefore, the second transistor switch T12 and the first transistor switch T21 are turned on. The first transistor switch T11 and the second transistor switch T22 are turned off. At this time, the first switching unit 141 conducts the negative terminal Tn to the first impedance circuit 120 through the second transistor switch T12. The second switching unit 142 conducts the positive terminal Tp to the second impedance circuit 130 through the first transistor switch T21.

In the embodiments disclosed above, a switching circuit can be disposed and configured to periodically conduct a negative terminal to one of a first impedance node and a second impedance node, and periodically conduct a positive terminal to the other one of the first impedance node and the second impedance node. The switching operations simultaneously performed by the switching circuit and a chopper operational amplifier in a the frequency generation circuit can achieve noise cancellation. Consequently, an output clock signal generated by the frequency locked loop circuit can have less jitter caused by noises generated by current sources and the frequency generation circuit.

It will be apparent to those skilled in the art that various modifications and variations can be made to the structure of the present disclosure without departing from the scope or spirit of the present disclosure. In view of the foregoing, it is intended that the present disclosure cover modifications and variations of this present disclosure provided they fall within the scope of the following claims.

What is claimed is:
1. A frequency locked loop circuit, comprising:
a frequency generation circuit comprising a positive terminal and a negative terminal, wherein the negative terminal is electrically coupled to a first current source, the positive terminal is electrically coupled to a second current source, and the frequency generation circuit is configured to output an output clock signal according to a voltage difference between the positive terminal and the negative terminal;
a first impedance circuit electrically coupled to a first impedance node;

a second impedance circuit electrically coupled to a second impedance node, wherein the second impedance circuit is configured to adjust an impedance value of the second impedance circuit according to the output clock signal; and a switching circuit electrically coupled to the first impedance node, the second impedance node, the positive terminal and the negative terminal, wherein the switching circuit is configured to periodically conduct the negative terminal to one of the first impedance node and the second impedance node, and periodically conduct the positive terminal to the other one of the first impedance node and the second impedance node;

wherein the second impedance circuit comprises a plurality of impedance units each coupled between the second impedance node and a reference voltage and a first capacitor coupled between the second impedance node and the reference voltage.

2. The frequency locked loop circuit of claim 1, wherein the frequency generation circuit is further configured to generate a first clock signal and a second clock signal according to the output clock signal and provide the first clock signal and the second clock signal to the second impedance circuit.

3. The frequency locked loop circuit of claim 1, wherein the frequency generation circuit is further configured to generate a first control signal and a second control signal according to the output clock signal and provide the first control signal and the second control signal to the switching circuit.

4. The frequency locked loop circuit of claim 1, wherein the switching circuit comprises a plurality of switching units, comprising:

a first switching unit electrically coupled to the first impedance node, the second impedance node and the negative terminal, wherein the first switching unit is configured to conduct the negative terminal to one of the first impedance node and the second impedance node according to a first control signal and a second control signal; and a second switching unit electrically coupled to the first impedance node, the second impedance node and the positive terminal, wherein the second switching unit is configured to conduct the positive terminal to the other one of the first impedance node and the second impedance node according to the first control signal and the second control signal.

5. The frequency locked loop circuit of claim 4, wherein a frequency of each of the first control signal and the second control signal is less than a frequency of a first clock signal and a second clock signal, the first clock signal and the second clock signal are generated by the frequency generation circuit according to the output clock signal.

6. The frequency locked loop circuit of claim 4, wherein a level of the first control signal and a level of the second control signal are opposite.

7. The frequency locked loop circuit of claim 4, wherein each of the switching units comprises:

a first transistor switch electrically coupled to one of the first impedance node and the second impedance node, and electrically coupled to one of the positive terminal and the negative terminal, wherein the first transistor switch is further configured to turn on or turn off according to one of the first control signal and the second control signal; and a second transistor switch electrically coupled to the other one of the first impedance node and the second impedance node, and electrically coupled to the one of the positive terminal and the negative terminal, wherein the second transistor switch is further configured to turn on or turn off according to the other one of the first control signal and the second control signal.

8. The frequency locked loop circuit of claim 1, wherein each of the impedance units comprises:

a first impedance switch electrically coupled to the second impedance node, and configured to be controlled according to the output clock signal;

a second impedance switch electrically coupled to the first impedance switch and the reference voltage, and configured to be controlled according to the output clock signal, wherein a conducted timing of the first impedance switch and the second impedance switch are opposite; and a second capacitor electrically coupled in parallel to the second impedance switch in parallel.

9. The frequency locked loop circuit of claim 1, wherein the frequency generation circuit comprises:

a chopper operational amplifier configured to receive the voltage difference between the positive terminal and the negative terminal to output an operational voltage signal; and a low frequency pass filter electrically coupled to an output terminal of the chopper operational amplifier to receive the operational voltage signal, and configured to filter a high frequency signal of the operational voltage signal.

10. The frequency locked loop circuit of claim 9, wherein the frequency generation circuit further comprises a frequency conversion circuit configured to receive an output signal of the low frequency pass filter, and generate the output clock signal.

11. The frequency locked loop circuit of claim 10, wherein the frequency generation circuit further comprises a frequency divider coupled to the frequency conversion circuit, configured to generate a first clock signal and a second clock signal according to the output clock signal and provide the first clock signal and the second clock signal to the second impedance circuit.

12. The frequency locked loop circuit of claim 1, further comprising a current mirror comprising the first current source and the second current source, and the switching circuit comprises a first switching unit electrically coupled to the first current source through the negative terminal of the frequency generation circuit and a second switching unit electrically coupled to the second current source through the positive terminal of the frequency generation circuit.

13. A frequency locked loop circuit, comprising:

a frequency generation circuit comprising a positive terminal and a negative terminal, wherein the negative terminal is electrically coupled to a first current source, the positive terminal is electrically coupled to a second current source, and the frequency generation circuit is configured to output an output clock signal according to a voltage difference between the positive terminal and the negative terminal;

a first impedance circuit electrically coupled to a first impedance node;

a second impedance circuit electrically coupled to a second impedance node, wherein the second impedance circuit is configured to adjust an impedance value of the second impedance circuit according to the output clock signal; and a switching circuit electrically coupled to the first impedance node, the second impedance node, the positive terminal and the negative terminal, wherein the switching circuit is configured to periodically conduct the negative terminal to one of the first impedance node and the second impedance node, and periodically conduct the positive terminal to the other one of the first impedance node and the second impedance node;

wherein the frequency generation circuit further comprises:

a chopper operational amplifier configured to receive the voltage difference between the positive terminal and the negative terminal to output an operational voltage signal; and a low frequency pass filter electrically coupled to an output terminal of the chopper operational amplifier to receive the operational voltage signal, and configured to filter a high frequency signal of the operational voltage signal.

* * * * *